United States Patent
Ohtani

(10) Patent No.: US 7,727,831 B2
(45) Date of Patent: Jun. 1, 2010

(54) SEMICONDUCTOR DEVICE

(75) Inventor: Kinya Ohtani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 37 days.

(21) Appl. No.: 11/229,524

(22) Filed: Sep. 20, 2005

(65) Prior Publication Data

US 2006/0113577 A1 Jun. 1, 2006

(30) Foreign Application Priority Data

Sep. 28, 2004 (JP) ............................. 2004-281002

(51) Int. Cl.
*H01L 21/8238* (2006.01)
(52) U.S. Cl. .................... 438/199; 438/211; 438/217; 438/257; 438/258; 438/266; 438/275; 438/294; 438/301; 438/392; 438/407; 438/440; 438/545; 438/586; 438/595; 257/319; 257/372; 257/392; 257/399; 257/402
(58) Field of Classification Search .............. 257/329, 257/330, 328, 335; 438/212, 226, 272, 268
See application file for complete search history.

(56) References Cited

U.S. PATENT DOCUMENTS

| | | | | |
|---|---|---|---|---|
| 4,495,025 A * | 1/1985 | Haskell | ...................... | 438/427 |
| 4,860,071 A * | 8/1989 | Sunami et al. | ............... | 257/305 |
| 5,233,215 A * | 8/1993 | Baliga | ........................ | 257/490 |
| 5,366,914 A * | 11/1994 | Takahashi et al. | ........... | 438/270 |
| 5,536,675 A * | 7/1996 | Bohr | .......................... | 438/427 |
| 5,583,358 A * | 12/1996 | Kimura et al. | ............... | 257/306 |
| 5,597,765 A * | 1/1997 | Yilmaz et al. | ................ | 438/270 |
| 5,614,751 A * | 3/1997 | Yilmaz et al. | ................ | 257/394 |
| 5,623,152 A * | 4/1997 | Majumdar et al. | .......... | 257/330 |
| 5,654,225 A * | 8/1997 | Zambrano | .................... | 438/138 |
| 5,831,288 A * | 11/1998 | Singh et al. | ................... | 257/77 |
| 5,877,528 A * | 3/1999 | So | .............................. | 257/341 |
| 6,031,265 A * | 2/2000 | Hshieh | ........................ | 257/334 |
| 6,096,608 A * | 8/2000 | Williams | ..................... | 438/270 |
| 6,211,549 B1* | 4/2001 | Funaki et al. | ............... | 257/329 |
| 6,277,707 B1* | 8/2001 | Lee et al. | ..................... | 438/430 |
| 6,472,678 B1* | 10/2002 | Hshieh et al. | .................. | 257/3 |
| 6,476,444 B1* | 11/2002 | Min | ........................... | 257/330 |

(Continued)

FOREIGN PATENT DOCUMENTS

JP 2002-373988 12/2002

*Primary Examiner*—Fernando L Toledo
*Assistant Examiner*—Ankush K Singal
(74) *Attorney, Agent, or Firm*—McGinn IP Law Group PLLC

(57) ABSTRACT

The leakage current generated due to the extension of the depleted layer to the end of the chip is reduced. In MOSFET 100, the depths of the trenches 112 in the gate pad portion 50 and the circumference portion 70 are larger than the depths of the trenches 111 in the cell region 60. Therefore, the depleted layer extending from the cell region 60 along the direction toward the gate pad portion 50 or the direction toward the circumference portion 70 is blocked by the presence of the trench 112. In other words, an extending of the depleted layer can be terminated by disposing the trench 112, so as to avoid reaching the depleted layer to the end of the semiconductor chip. Accordingly, a leakage current generated from the cell region 60 along the direction toward the end of the semiconductor chip can be reduced.

10 Claims, 3 Drawing Sheets

U.S. PATENT DOCUMENTS

| | | | |
|---|---|---|---|
| 6,518,621 B1* | 2/2003 | Hshieh et al. | 257/328 |
| 6,710,403 B2* | 3/2004 | Sapp | 257/330 |
| 6,750,507 B2* | 6/2004 | Williams et al. | 257/328 |
| 6,781,201 B2* | 8/2004 | Yamaguchi | 257/331 |
| 6,798,018 B2* | 9/2004 | Takaishi et al. | 257/334 |
| 6,818,947 B2* | 11/2004 | Grebs et al. | 257/330 |
| 6,825,510 B2* | 11/2004 | Probst | 257/208 |
| 6,855,981 B2* | 2/2005 | Kumar et al. | 257/328 |
| 6,861,703 B2* | 3/2005 | Inagawa et al. | 257/330 |
| 6,998,674 B2* | 2/2006 | Osada et al. | 257/316 |
| 6,998,678 B2* | 2/2006 | Werner et al. | 257/334 |
| 7,005,351 B2* | 2/2006 | Henninger et al. | 438/268 |
| 7,045,412 B2* | 5/2006 | Sugii et al. | 438/229 |
| 7,061,066 B2* | 6/2006 | Kocon | 257/476 |
| 7,084,457 B2* | 8/2006 | Hsieh et al. | 257/329 |
| 7,087,958 B2* | 8/2006 | Chuang et al. | 257/335 |
| 7,098,506 B2* | 8/2006 | Inagawa et al. | 257/330 |
| 7,230,297 B2* | 6/2007 | Ono et al. | 257/330 |
| 7,265,024 B2* | 9/2007 | Hsieh et al. | 438/424 |
| 7,282,750 B2* | 10/2007 | Ducreux | 257/170 |
| 7,307,313 B2* | 12/2007 | Ohyanagi et al. | 257/330 |
| 7,345,342 B2* | 3/2008 | Challa et al. | 257/341 |
| 2001/0008788 A1* | 7/2001 | Hshieh et al. | 438/270 |
| 2001/0023961 A1* | 9/2001 | Hshieh et al. | 257/330 |
| 2001/0041407 A1* | 11/2001 | Brown | 438/270 |
| 2002/0030237 A1* | 3/2002 | Omura et al. | 257/397 |
| 2002/0060340 A1* | 5/2002 | Deboy et al. | 257/330 |
| 2002/0070418 A1* | 6/2002 | Kinzer et al. | 257/496 |
| 2002/0088989 A1* | 7/2002 | Kim | 257/135 |
| 2002/0088991 A1* | 7/2002 | Hisamoto | 257/172 |
| 2002/0142548 A1* | 10/2002 | Takaishi | 438/270 |
| 2002/0151124 A1* | 10/2002 | Kim et al. | 438/197 |
| 2003/0020134 A1* | 1/2003 | Werner et al. | 257/471 |
| 2003/0042538 A1* | 3/2003 | Kumar et al. | 257/328 |
| 2003/0052383 A1* | 3/2003 | Nemoto et al. | 257/471 |
| 2003/0203576 A1* | 10/2003 | Kitada et al. | 438/270 |
| 2004/0084721 A1* | 5/2004 | Kocon et al. | 257/328 |
| 2004/0119118 A1* | 6/2004 | Williams et al. | 257/355 |
| 2004/0137684 A1* | 7/2004 | Ma et al. | 438/270 |
| 2005/0112823 A1* | 5/2005 | Cao et al. | 438/270 |
| 2005/0151190 A1* | 7/2005 | Kotek et al. | 257/341 |
| 2005/0167742 A1* | 8/2005 | Challa et al. | 257/328 |
| 2005/0242392 A1* | 11/2005 | Pattanayak et al. | 257/328 |
| 2006/0014349 A1* | 1/2006 | Williams et al. | 438/270 |
| 2006/0076615 A1* | 4/2006 | Tihanyi | 257/330 |
| 2006/0124994 A1* | 6/2006 | Jang et al. | 257/328 |
| 2006/0124996 A1* | 6/2006 | Mizokuchi et al. | 257/330 |
| 2006/0209887 A1* | 9/2006 | Bhalla et al. | 370/466 |
| 2006/0214221 A1* | 9/2006 | Challa et al. | 257/328 |
| 2006/0226504 A1* | 10/2006 | Hatakeyama et al. | 257/472 |
| 2006/0261391 A1* | 11/2006 | Nakazawa et al. | 257/296 |
| 2006/0292793 A1* | 12/2006 | Sandhu et al. | 438/257 |
| 2007/0023830 A1* | 2/2007 | Pfirsch et al. | 257/341 |
| 2008/0001217 A1* | 1/2008 | Kawashima | 257/330 |
| 2008/0073710 A1* | 3/2008 | Yamamoto | 257/334 |
| 2008/0116520 A1* | 5/2008 | Grover | 257/362 |

* cited by examiner

SEMICONDUCTOR DEVICE

This application is based on Japanese Patent Application NO. 2004-281,002, the content of which is incorporated hereinto by reference.

BACKGROUND OF THE INVENTION

1. Technical Field

The present invention relates to a semiconductor device having a field effect transistor (FET).

2. Related Art

Upon providing a cell shrinkage for a trench-based metal oxide semiconductor field effect transistor (MOSFET), the cell shrinkage is hampered due to dimensions of an edge of a side surface of the trench and a contact portion, and in order to solve the problem, a structure having an interlayer film embedded in the inside of the trench is proposed (see Japanese Patent Laid-Open No. 2002-373,988).

A configuration of a conventional device having an interlayer film embedded in the inside of a trench illustrated in "FIG. 1(a)" of Japanese Patent Laid-Open No. 2002-373,988 is roughly transcribed in FIG. 4. A trench-based MOSFET comprises a cell region having a trench structure, in which a gate electrode 5 is provided within a trench 11 via a gate oxide film 4 intervening therebetween, which is formed in a semiconductor layer 1 on a semiconductor substrate 1a. An insulating film 6 is provided on the gate electrode 5, and a source electrode 7 is provided on the insulating film 6. A source region 3 and a channel diffusion region 2 are formed on the side of the trench 11. Further, it is configured that a gate pad 5a is formed on a gate oxide film 4a within a trench 12 that is formed simultaneously with forming the trench 11 provided in the cell region, and that a circumference portion including the gate pad 5a surrounds the cell region.

However, in the technology described in Japanese Patent Laid-Open No. 2002-373,988, a depleted layer 16 extends through a portion under the trench 12 of the gate pad and beyond the circumference portion to the end of the chip, as shown in FIG. 5. Therefore, a leakage current may be generated from the transistor in the cell region through the depleted layer along the direction toward the end of the chip.

The present invention is made on the basis of such circumstances, and it is preferable to reduce the leakage current generated due to the extension of the depleted layer to the end of the chip.

SUMMARY OF THE INVENTION

According to one aspect of the present invention, there is provided a semiconductor device having a field effect transistor, the field effect transistor comprises: a semiconductor substrate; a semiconductor layer formed on the semiconductor substrate; a trench formed in the semiconductor layer; a gate electrode provided within the trench via an gate insulating film intervening therebetween; an insulating film provided on an upper portion of the gate electrode in the interior of the trench; a source region provided on the side of the trench in an upper surface of the semiconductor layer; a source electrode provided on upper portions of the insulating film and the source region; a drain region provided under the trench; and a drain electrode provided on a back surface of the semiconductor substrate, wherein the insulating film provides an electrical insulation of the gate electrode from the source electrode, wherein the semiconductor device comprises a cell portion and a terminal end provided in a periphery of the cell portion, and has the field effect transistor in the cell portion and has a trench in the terminal end, and wherein a bottom surface of the trench provided on the terminal end is positioned to be lower than a bottom surface of the trench of the field effect transistor provided on the cell portion.

According to the present invention, the configuration is employed, in which the bottom surface of the trench provided in the terminal end is positioned to be lower than the bottom surface of the trench in the field effect transistor provided in the cell portion. Thus, an extension of the depleted layer is blocked by the trench in the terminal end. Therefore, the leakage current from the field effect transistor in the cell portion along the direction toward the end can be effectively reduced.

As have been described above, according to the present invention, the depth of the trench provided in the terminal end is deeper than the depth of the trench provided in the cell portion. Therefore, an extension of the depleted layer is blocked by the trench in the terminal end, and the leakage current from the field effect transistor in the cell portion along the direction toward the end can be reduced.

BRIEF DESCRIPTION OF THE DRAWINGS

The above and other objects, advantages and features of the present invention will be more apparent from the following description taken in conjunction with the accompanying drawings, in which.

In these drawings, the symbols have the following meanings; 50: gate pad portion, 60: cell region, 70: circumference portion, 100: MOSFET, 101: semiconductor layer, 101a: silicon substrate, 102: channel diffusion region, 103: source region, 104: oxide film, 105: gate electrode, 105a: gate electrode, 106: gate polysilicon, 106a: gate polysilicon, 111: trench, 112: trench, 118: oxide film, 130: insulating film, 132: polysilicon, 140: bidirectional protection diode, 150: source electrode, 152: gate electrode, 160: drain electrode, 200: MOSFET.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

First Embodiment

Figure 1A:
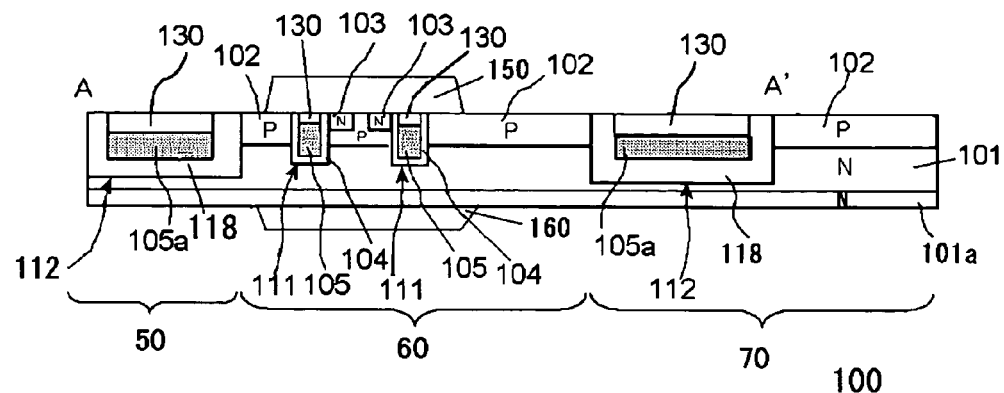
FIG. 1A is a schematic cross-sectional view of a MOSFET according to an embodiment.
Figure 1B:
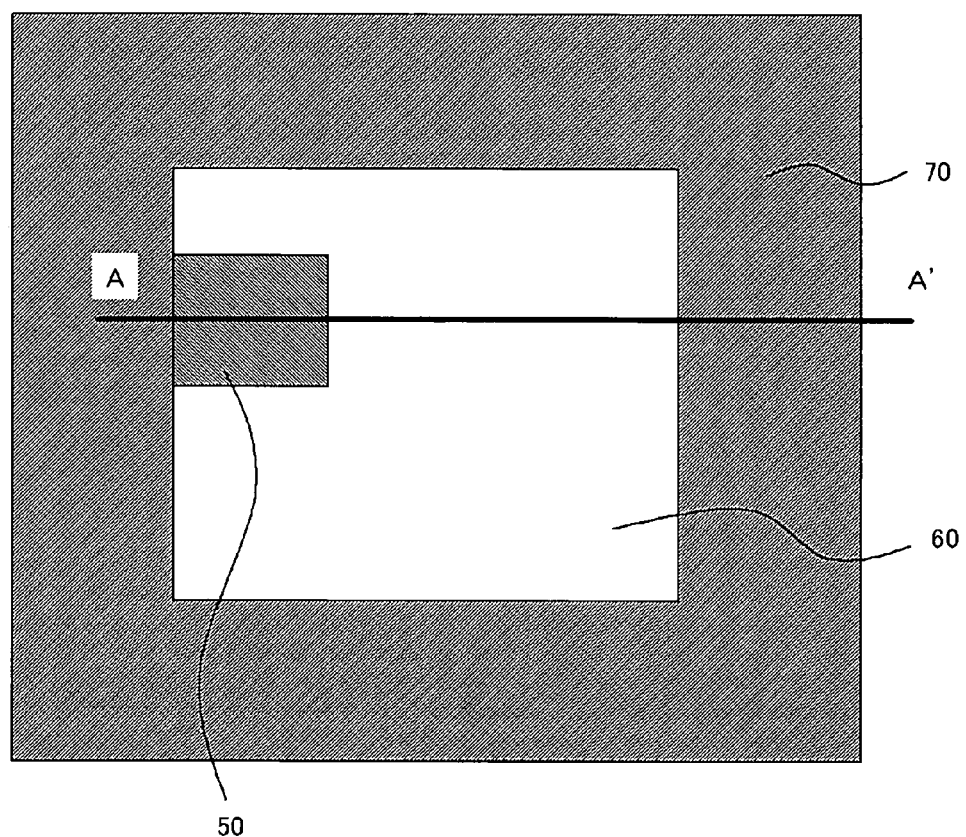
FIG. 1B is a plan view of the MOSFET shown in FIG. 1A.

A metal oxide semiconductor field effect transistor (MOSFET) 100 according to the present embodiment is shown in FIG. 1A and FIG. 1B. FIG. 1A is a cross-sectional view schematically showing A-A' sectional view of FIG. 1B.

The MOSFET 100 is composed of a silicon substrate 101a, a semiconductor layer 101 formed on the silicon substrate 101a, and a trench formed in the semiconductor layer 101.

The silicon substrate 101a is doped with an n-type impurity, and the semiconductor layer 101 doped with an n-type impurity, which is formed via an epitaxy process, is formed thereon. Further, a channel diffusion region 102 doped with a p-type impurity is formed on an upper surface of the semiconductor layer 101. In such case, the semiconductor layer 101 functions as a drain region.

Trenches are provided in a gate pad portion 50 and a circumference portion 70, both of which function as terminal ends, and in a cell region 60 (cell portion), respectively, and in the present embodiment, trenches 112 in the gate pad portion 50 and the circumference portion 70 are formed by a different process from that for forming trenches 111 in the cell region 60, and further, the bottom surfaces of the trenches 112 are positioned to be lower than the bottom surfaces of the trenches 111. As shown in FIG. 1B that is a plan view of FIG. 1A, the gate pad portion 50 and the circumference portion 70 are disposed to enclose the cell region 60. Although a depleted layer is disposed under the trench 111 in the cell region 60, the depleted layer is blocked by the trench 112 since the bottom surface of the trench 112 is positioned to be lower than the bottom surface of trench 111, and therefore the depleted layer is neither extended to the region of the gate pad portion 50 nor to the region of the circumference portion 70.

A gate electrode 105a is embedded within the inside wall of the trench 112 via an oxide film 118 intervening therebetween. Further, an insulating film 130 (interlayer film) is provided on the gate electrode 105a in the inside of the trench 112 so as to contact with the upper surface of the gate electrode 105a. A gate electrode 105 is embedded within the inside wall of the trench 111 via an oxide film 104 as a gate insulating film intervening therebetween. In addition, an insulating film 130 is provided in the inside of the trench 111 and on the gate electrode 105 so as to contact with the upper surface of the gate electrode 105. Although the present embodiment illustrates that the insulating film 130 is formed such that the entire upper surface of the insulating film 130 has the same surface level as the upper surface of semiconductor layer 101 in the regions including the gate pad portion 50, the cell region 60 and the circumference portion 70, the entire upper surface of the insulating film 130 may also be formed to have a lower surface level than the upper surface of the semiconductor layer 101. In addition, the thickness of the oxide film 118 is larger than the thickness of the oxide film 104.

Source regions 103, which are doped with an n-type impurity in the upper surface of the semiconductor layer 101, are formed on the sides of the trench 111. In addition, channel diffusion regions 102, which are doped with a p-type impurity in the upper surface of the semiconductor layer 101, are formed on both sides of the trench 111 and the trench 112.

A source electrode 150 is provided on the upper portion of the insulating film 130 of the cell region 60 and on the upper portion of the source region 103, so as to contact with the insulating film 130 and the source region 103. In other words, the insulating film 130 provides an electrical insulation between the source electrode 150 and the gate electrode 105.

In addition, a drain electrode 160 is provided on the back surface of the silicon substrate 101a.

The process for manufacturing the MOSFET 100 will be described as follows in reference to FIG. 2.

Figure 2A:
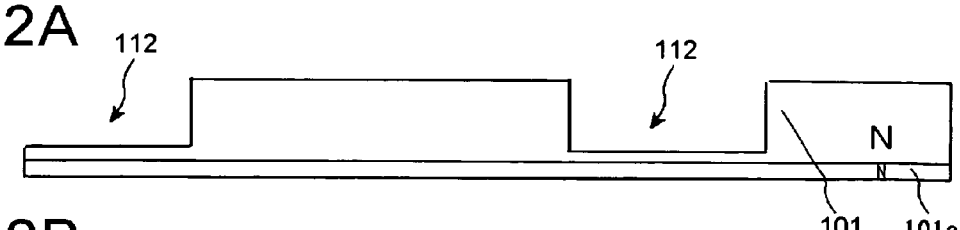
FIGS. 2A to 2F are schematic cross-sectional views of the MOSFET according to the embodiment, showing a process for manufacturing the MOSFET according to the embodiment.

First, the semiconductor layer 101 is formed via an epitaxy on the silicon substrate 101a. Then, in the semiconductor layer 101, the trenches 112 having a deeper depth than the trenches 111 that are to be formed in the cell region 60 discussed later are formed for the trench for being filled with polysilicon (i.e., trench in gate pad portion and trench in circumference portion) (FIG. 2A).

Figure 2B:
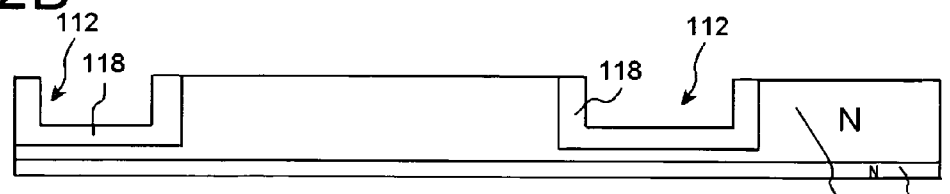

Next, the oxide film 118 having a relatively larger thickness is deposited within each of the trenches 112. The thickness of the oxide film 118 may be on the order of several thousands angstroms to ten and several thousands angstroms (FIG. 2B).

Figure 2C:
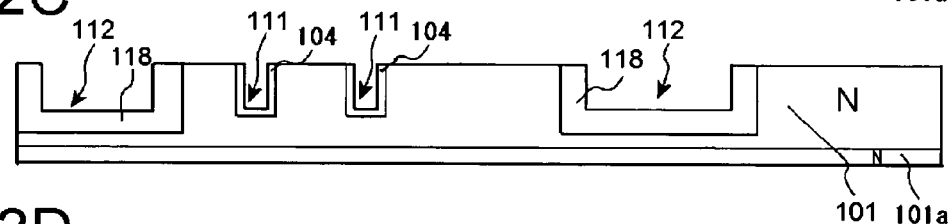
Figure 2D:
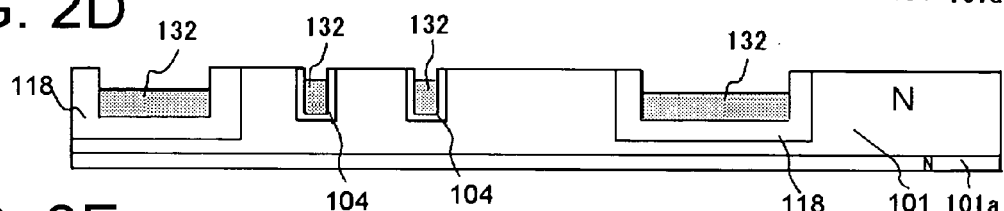

Subsequently, a patterning process is conducted, and thereafter, an etching process is carried out to form a portion that will be the gate pad portion 50 and the circumference portion 70. Next, the trench 111 having a depth of approximately 1 to 3 μm is formed in the cell region 60, and then the oxide film 104 is formed so as to contact with the inside wall of the trench 111 (FIG. 2C).

Figure 2E:
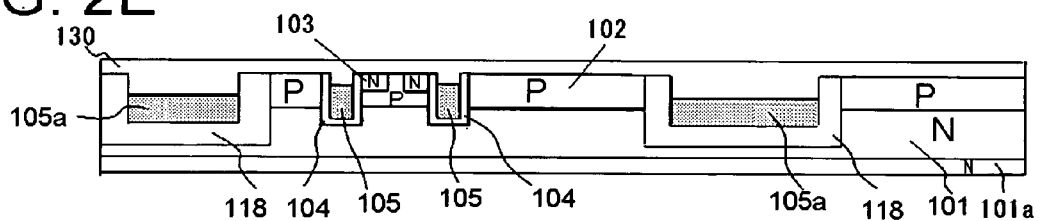

Subsequently, a polysilicon 132 is deposited in each of the trenches (FIG. 2D), and then a patterning process is conducted so as to leave the polysilicons 132 in both of the gate pad portion 50 and the circumference portion 70, respectively, and thereafter, an etching process is conducted to form the gate polysilicon 105 and the gate polysilicon 105a. Further, the channel diffusion region 102 and the source region 103 are formed. Then, a patterning process is conducted, and thereafter, the diffusion layer is formed, and the insulating film 130 is deposited (FIG. 2E).

Figure 2F:
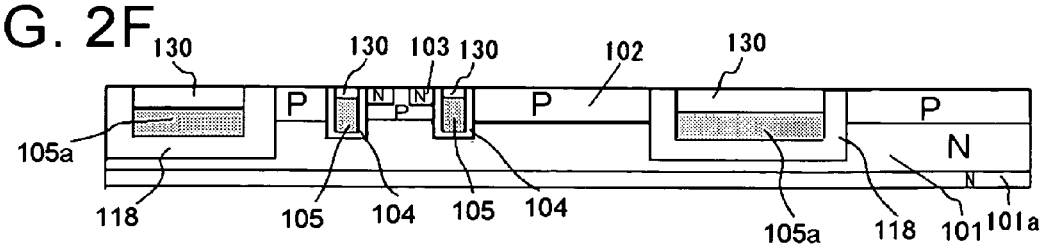

Then, the upper surface of the semiconductor layer 101 is processed so as to be coplanar with the upper surface of the insulating film 130 via an entire surface-etching or a chemical mechanical polishing (CMP) process or the like (FIG. 2F). Alternatively, an excessive etching may also be conducted until providing the upper surface of insulating film 130 having a lower level than the level of the upper surface of the semiconductor layer 101 (i.e., upper surface of trench). In such case, a contact for the gate electrode 105 may be separately provided. In addition, if the process for forming the diffusion layer is conducted in the later process, the formation of the contact for the gate electrode may double as the patterning process. Next, the source electrode 150 is provided so as to contact with the upper surface of the insulating film 130 and to contact with the channel diffusion region 102 and the source region 103, and the drain electrode 160 is provided on the back side of the silicon substrate 101a via a known method.

The MOSFET 100 is completed by the above-mentioned process.

Advantageous effects obtainable by having the configuration according to the present embodiment will be described as follows.

In MOSFET 100, the depths of the trenches 112 in the gate pad portion 50 and the circumference portion 70 are larger than the depths of the trenches 111 in the cell region 60. Therefore, the depleted layer extending from the cell region 60 along the direction toward the gate pad portion 50 or the direction toward the circumference portion 70 is blocked by the presence of the trench 112. In other words, an extending of the depleted layer can be terminated by disposing the trench 112, so as to avoid reaching the depleted layer to the end of the semiconductor chip. Accordingly, a leakage current generated from the cell region 60 along the direction toward the end of the semiconductor chip can be reduced.

In addition, since the depths of the trenches 112 in the gate pad portion 50 and the circumference portion 70 are larger than the depths of the trenches 111 in the cell region 60, it is possible to provide larger thickness of the oxide film 118 formed in the trench 112 than the thickness of the oxide film 104 formed in the trench 111. Therefore, an extending of the depleted layer can be more effectively inhibited by the presence of the oxide film 118.

The MOSFET 100 is employed in the form of the package encapsulated with an encapsulating resin, and thus a difference in the thermal shrinkage coefficient is existed between the semiconductor chip and the encapsulating resin, and more specifically, the thermal shrinkage coefficient of the encapsulating resin is larger than the thermal shrinkage coefficient of the semiconductor chip in the condition of decreasing the temperature. In the conventional technology described in Japanese Patent Laid-Open No. 2002-373,988, the upper surfaces of the insulating films in the gate pad portion 50, the cell region 60 and the circumference portion 70 have levels higher than the level of the upper surface of the semiconductor layer. Since the package undergoes a thermal history when it is operated in such case, a compressive stress may be exerted on a portion of the surface of the insulating film located at higher position than the level of the upper surface of the semiconductor layer, due to a shrinkage of the encapsulating resin in the periphery of the insulating film caused in the process of dropping the temperature. On the other hand, in the present embodiment, the upper surfaces of insulating films 130 in all of the gate pad portion 50, the cell region 60 and the circumference portion 70 have surface levels that are the same as or lower than the level of the upper surface of the semiconductor layer 101. More specifically, the surface of the insulating film 130 is coplanar with the surface of the semiconductor layer 101, or a concave portion is included on the surface of the insulating film 130. Therefore, the compressive stress exerted on the insulating film in the process of dropping the temperature can be reduced. Accordingly, the stress exerted on the whole semiconductor chip can be reduced.

Second Embodiment

A MOSFET 200 according to the present embodiment differs from the MOSFET described in first embodiment in terms of being provided with a bidirectional protection diode formed in the gate pad portion.

Figure 3:
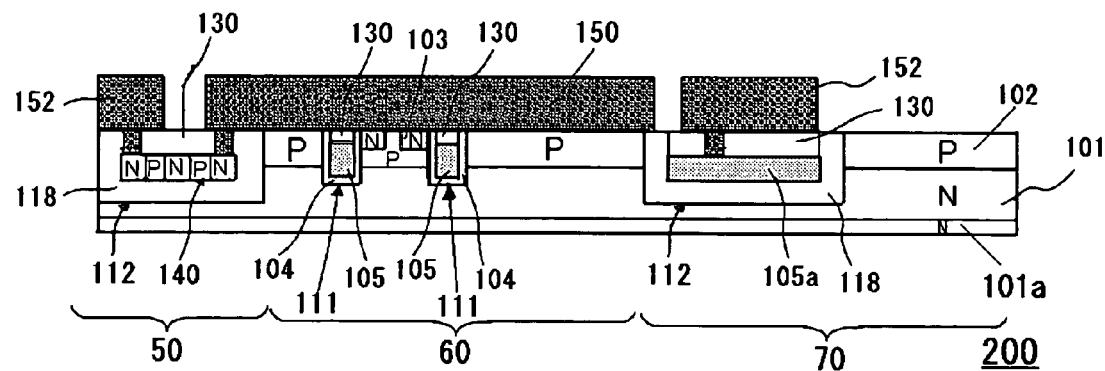
FIG. 3 is a schematic cross-sectional view of a MOSFET according to another embodiment.
Figure 4:
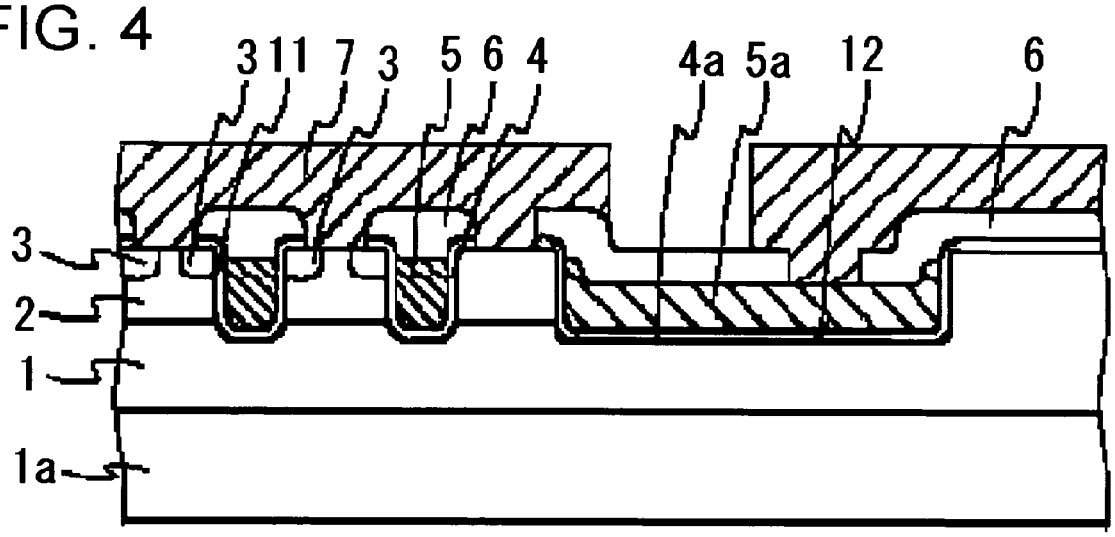
FIG. 4 is a schematic cross-sectional view of a MOSFET according to the conventional technology.
Figure 5:
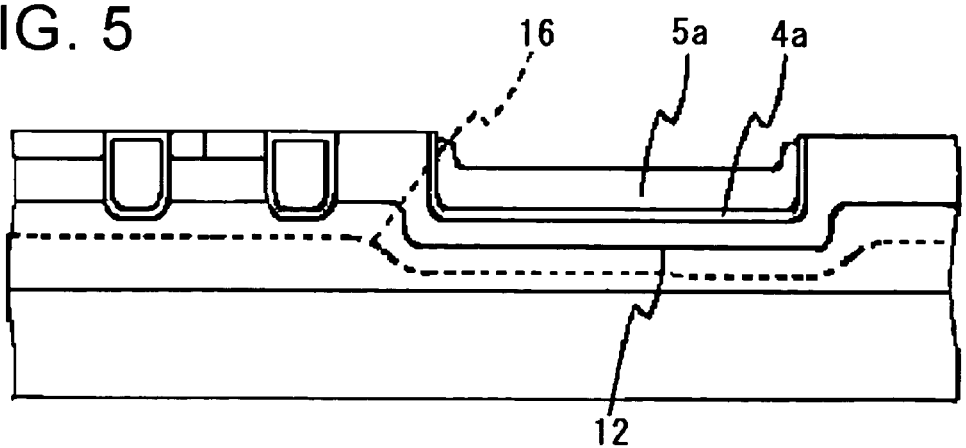
FIG. 5 is a schematic cross sectional view of a MOSFET according to the conventional technology.

The MOSFET 200 having a bidirectional protection diode 140 formed in the gate pad portion 50 and being provided with a gate electrode 152 is shown in FIG. 3.

The bidirectional protection diode 140 functions as protecting a circuit when an electrical voltage, which is equal to or higher than the source voltage, is applied to the gate electrode 105 and the gate electrode 105a.

Advantageous effects obtainable by having the configuration according to the present embodiment will be described as follows.

The bidirectional protection diode 140 is formed as a semiconductor element within the trench of the gate pad portion 50 in the MOSFET 200 in the present embodiment. Therefore, the function for protecting the circuit when an electrical voltage, which is equal to or higher than the source voltage, is applied to the gate electrode 105 and the gate electrode 105a can be improved, in addition to the advantageous effect obtained in first embodiment.

While the preferred embodiments of the present invention have been described above in reference to the annexed figures, it should be understood that the disclosures above are presented for the purpose of illustrating the present invention, and various configurations other than the above described configurations can also be adopted.

For example, while the configuration comprising the MOSFET is illustrated in the above embodiment, a metal insulator semiconductor field effect transistor (MISFET) may also be employed.

In addition, while the configuration comprising the bidirectional protection diode 140 formed therein is illustrated in second embodiment, any other diode such as other type of protection diode may be formed, or a field effect transistor may be formed, as an alternative semiconductor element.

Further, while the configuration comprising the source electrode 150 formed on the upper portions of the insulating film 130 and the source region 103 so as to contact with the insulating film 130 and the source region 103 is illustrated in the above embodiments, an alternative configuration comprising a film or the like interposed between the source electrode 150 and the source region 103 may also be employed, provided that an electrical coupling between the source electrode 150 and the source region 103 is provided. Further, a film or the like may be interposed between the source electrode 150 and the source region 103.

It is apparent that the present invention is not limited to the above embodiment, that may be modified and changed without departing from the scope and spirit of the invention.

What is claimed is:

1. A semiconductor device having a field effect transistor, comprising:
    a semiconductor layer;
    a first trench formed in the semiconductor layer;
    a gate electrode provided within the first trench via a gate insulating film intervening therebetween;
    a second trench formed in the semiconductor layer;
    a first insulating film provided in an interior of the second trench;
    a protection element provided in the second trench via the first insulating film, the protection element having a first node and a second node;
    a second insulating film provided inside the second trench and covering the protection element, the second insulating film having a first via corresponding to the first node and a second via corresponding to the second node;
    a source region provided in the semiconductor layer;
    a source electrode connected to the source region; and
    a drain electrode provided on a back surface of the semiconductor layer,
    wherein a bottom surface of the second trench is positioned to be lower than a bottom surface of the first trench, and
    wherein the first node of the protection element is electrically connected to the gate electrode via the first via of the second insulating film and the second node of the protection element is connected to the source electrode via the second via of the second insulating film.

2. The semiconductor device according to claim 1, wherein the first insulating film is thicker than the gate insulating film.

3. The semiconductor device according to claim 1, wherein the semiconductor device comprises a cell portion and a terminal end provided in a periphery of the cell portion, and has the first trench in the cell portion and has the second trench in the terminal end.

4. The semiconductor device according to claim 1, further comprising a gate pad electrode electrically connected to the gate electrode.

5. The semiconductor device according to claim 1, wherein the protection element comprises a diode.

6. The semiconductor device according to claim 1, wherein the protection element comprises a field effect transistor.

7. The semiconductor device according to claim 1, wherein said second trench blocks a depleted layer from one of a gate pad portion and a circumferential portion of the semiconductor substrate, said depleted layer being disposed under the first trench.

8. The semiconductor device according to claim 3, wherein the second trench surrounds a periphery of the cell portion when viewed in plan view.

9. The semiconductor device according to claim 3, wherein the drain electrode is provided in the cell portion and devoid of the terminal end.

10. The semiconductor device according to claim 8, wherein a depleted layer of the cell portion is blocked by the second trench.

* * * * *